United States Patent [19]

Matsukawa

[11] Patent Number: 4,845,530
[45] Date of Patent: Jul. 4, 1989

[54] REDUCED PROJECTION TYPE STEP- AND REPEAT-EXPOSURE APPARATUS

[75] Inventor: Naohiro Matsukawa, Kamakura, Japan

[73] Assignee: Kabushiki Kaisha Toshiba, Kawasaki, Japan

[21] Appl. No.: 130,215

[22] Filed: Dec. 8, 1987

[30] Foreign Application Priority Data

Dec. 26, 1986 [JP] Japan ................................ 61-315367
Oct. 5, 1987 [JP] Japan ................................ 62-250886

[51] Int. Cl.$^4$ .......................................... G03B 27/42
[52] U.S. Cl. ...................................................... 355/53
[58] Field of Search ................... 355/53, 54, 68, 55; 356/71, 401

[56] References Cited

U.S. PATENT DOCUMENTS 4,585,337 4/1986 Phillips ............................ 355/53 X
4,704,020 11/1987 Murakami et al. ............... 355/53 X Primary Examiner—Richard A. Wintercorn
Attorney, Agent, or Firm—Finnegan, Henderson, Farabow, Garrett, & Dunner

[57] ABSTRACT

In a reduced projection type step- and repeat-exposure apparatus of the present invention, the angle of inclination of an exposure area on the wafer is first detected, and then corrected on the basis of the detected value. This measurement corrects the inclination of the exposure area. Hence, high precision patterning can be realized, even if an optical system having a small focus margin is used.

17 Claims, 7 Drawing Sheets

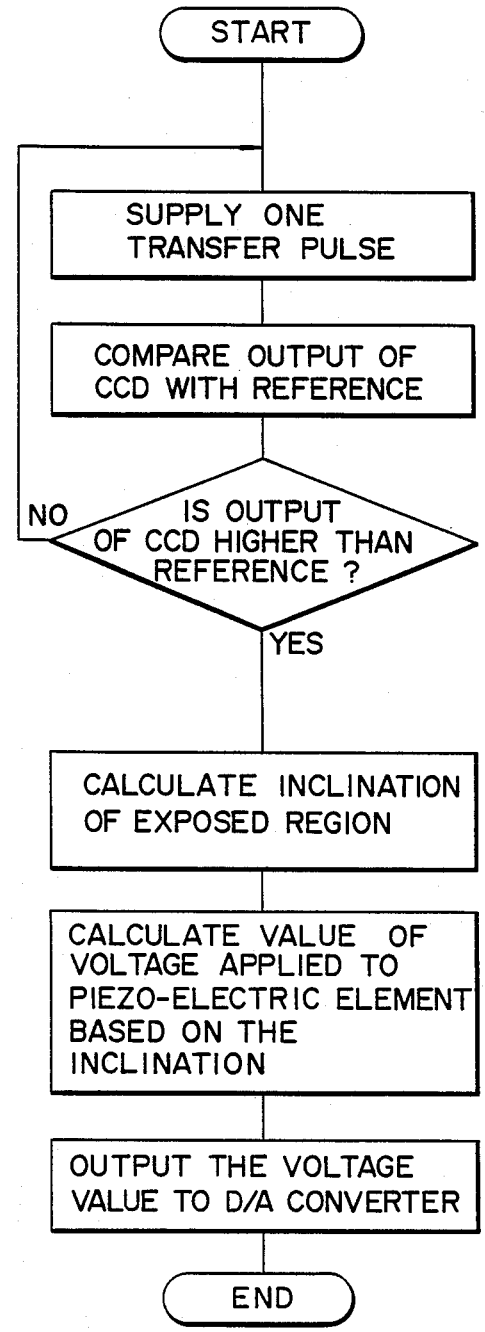
F I G. 3

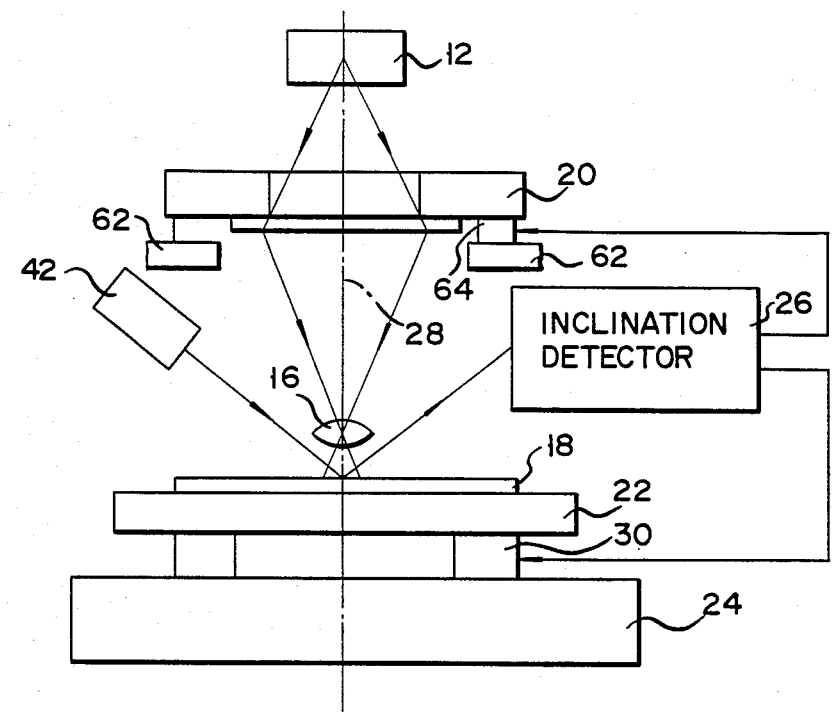
F I G. 6
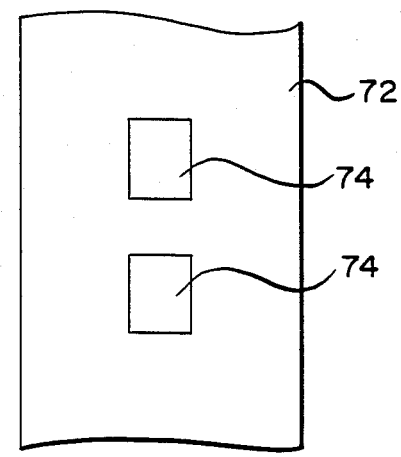
F I G. 7

REDUCED PROJECTION TYPE STEP- AND REPEAT-EXPOSURE APPARATUS

BACKGROUND OF THE INVENTION

This invention relates to a reduced projection type step- and repeat-exposure apparatus for forming a pattern on a semiconductor chip.

In the conventional reduced projection type step-and repeat-exposure apparatus, the mask and wafer are fixed at a certain angle with respect to the plane orthogonal to the optical axis of the exposure optical system, when a pattern is formed on a single semiconductor wafer.

Actually, the surface of the semiconductor wafer is irregular. For example, the irregularity of a 10×10 mm² wafer is about 3 μm in height. This figure is not negligible. Further, it implies that a relatively large focus margin is required for accurate patterning. The wafer surface irregularity is more remarkable when elements and circuit wiring are formed on the wafer. In this case, the required focus margin is at least 4 μm.

Increasing the resolution of the optical system is one of a number of effective approaches for realizing accurate patterning. However, increased resolution inevitably results in a reduction of the focus margin. For example, in order to form a pattern with a 0.8 μm width on the wafer by using a lens of 0.4 NA, the tolerable focus margin is then 3 μm maximum. When, however, the tolerable focus margin is 3 μm maximum, an accurate pattern can not be formed on a 10×10 mm² wafer whose irregularity is 3 μm minimum in height.

SUMMARY OF THE INVENTION

Accordingly, an object of this invention is to provide a reduced projection type step- and repeat-exposure apparatus which realizes high precision patterning onto a currently used semiconductor wafer, even if an optical system with a small focus margin is used.

To realize the above object, using the reduced projection type step- and repeat-exposure apparatus of the present invention, the angle of inclination of an exposure area on the wafer is first detected, and then corrected on the basis of the detected value. This measurement corrects the inclination of the exposure area. Hence, high precision patterning can be realized, even if an optical system having a focus margin of less than 3.0 μm is used.

A reduced projection type step- and repeat-exposure apparatus according to the present invention comprises:
an exposure optical system;
mask support means for supporting a mask having a predetermined pattern, which is arranged on an optical path of exposure optical system;
wafer support means for supporting a semiconductor wafer onto which the pattern of the mask is projected;
means for detecting the angle of inclination of an exposure area on the semiconductor wafer, with respect to the plane orthogonal to the optical axis of the exposure optical system; and
correcting means for correcting the angle of inclination of the exposure area, on the basis of the output signal from the detecting means.

BRIEF DESCRIPTION OF THE DRAWINGS

Fig. 3 shows a flowchart for explaining the operation of the detector unit of FIG. 1;

FIG. 6 is a schematic diagram illustrating a reduced projection type step- and repeat-exposure apparatus according to yet another embodiment of this invention;

FIG. 7 is a diagram showing a planar area formed in the scribe area on the wafer;

DETAILED DESCRIPTION OF THE PREFERRED EMBODIMENTS

Some specific embodiments of a reduced projection type step- and repeat-exposure apparatus according to this invention will be described referring to the accompanying drawings.

Figure 1:
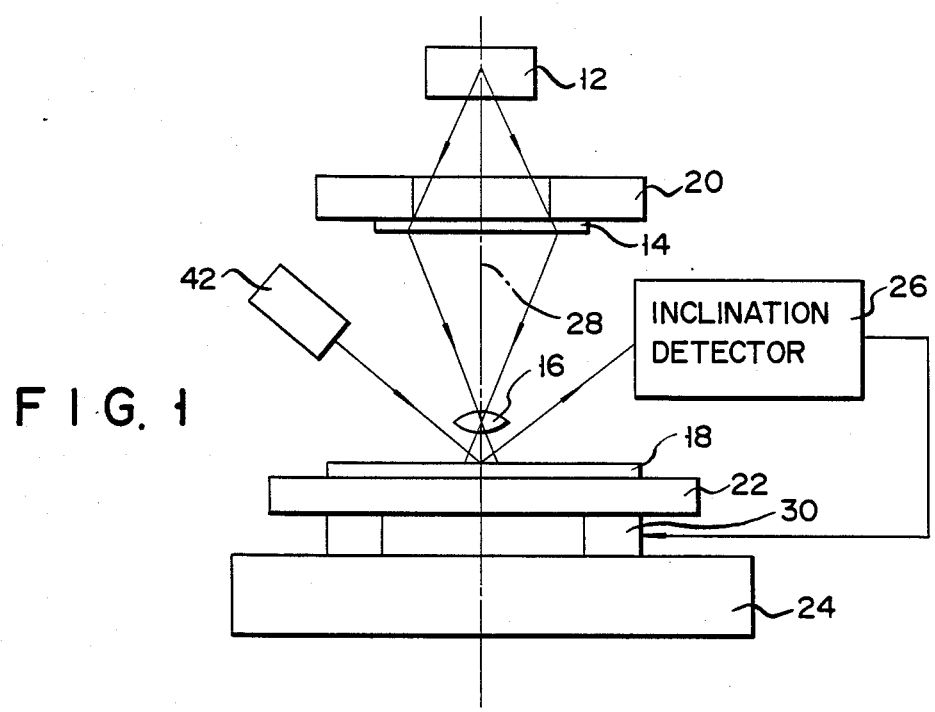
Fig. 1 is a schematic diagram illustrating a reduced projection type step- and repeat-exposure apparatus to an embodiment of this invention.

A reduced projection type step- and repeat-exposure apparatus with a 5:1 reduced projection, which is a first embodiment of this invention, is shown in FIG. 1. A light beam is emitted from light source 12, and projected onto semiconductor wafer 18 by way of mask 14 with a predetermined pattern and lens system 16. A pattern of mask 14 is projected on the wafer. Mask 14 is supported by support member 20. Wafer 18 is supported by another support member 22, which is also supported by support member 24. The wafer support member 22 is disposed on adjusting member including a piezo-electric element for correcting an angle of inclination of wafer 18 when it is excited by the output signal from inclination detector 26 to be described later. The inclination correction is made with respect to the plane orthogonal to the optical axis 28 of an optical system including light source 12 and lens system 16.

Laser source 42 generates narrow laser beams of 10 μm in diameter, for example. The emitted laser beams are projected to an exposure area of wafer 18. The exposure area is an area of one chip, for example, on the wafer. Inclination detector 26 detects an angle of inclination of the exposure area on wafer 18 with respect to the plane normal to the optical axis of the optical system, and produces a signal to correct the inclination.

Actually, the exposure apparatus further includes a focusing mechanism, a wafer positioning mechanism, and the like. Those mechanisms are not essential to this invention and hence not illustrated.

The operation of the reduced projection type step-and repeat-exposure apparatus thus arranged will be described.

Prior to the exposure for patterning, an angle of inclination of an exposure area on water 18 is detected with respect to the plane normal to the optical axis 28. The exposure area is the wafer area occupied by one chip, for example. More specifically, the exposure area of wafer 18 is positioned in a predetermined exposure area by the positioning mechanism (not shown). Then, laser source 42 is driven to emit the laser beams toward the exposure area. The laser beam reflected from the exposure area is received by inclination detector 26 and the detector detects an angle of inclination of the exposure area with respect the plane orthogonal to the optical axis 28. Detector 26 produces a correction signal for the detected angle of inclination, and applies it to adjusting member 30. The adjusting member corrects the inclination of the exposure area on the basis of the correction signal from detector 26. The detailed operation of inclination detector 26 will be described later.

After the correction, the exposure area is subjected to the exposure for patterning. For the exposure, the light beam is emitted from light source 12 and passes via mask 14 with a predetermined pattern and lens system 16, to the exposure area. The pattern of mask 14 is projected to the exposure area. After the pattern is projected to one exposure area on wafer 18, the positioning mechanism (not shown) is driven to position another exposure area in the predetermined exposure area. Subsequently, the above sequence of the procedural steps follows; the detection of an angle of the exposure area inclination, the inclination correction, the exposure of the area, and the patterning of the area.

In this way, the inclination of the exposure area with respect to the plane orthogonal to the optical axis of the optical system is corrected prior to the exposure for forming a pattern on an exposure area of the wafer. Therefore, high precision patterning is possible, even if the focus margin is small and the wafer of $10 \times 10$ mm$^2$ and about 3 μm in irregularity height is used.

Figure 2:
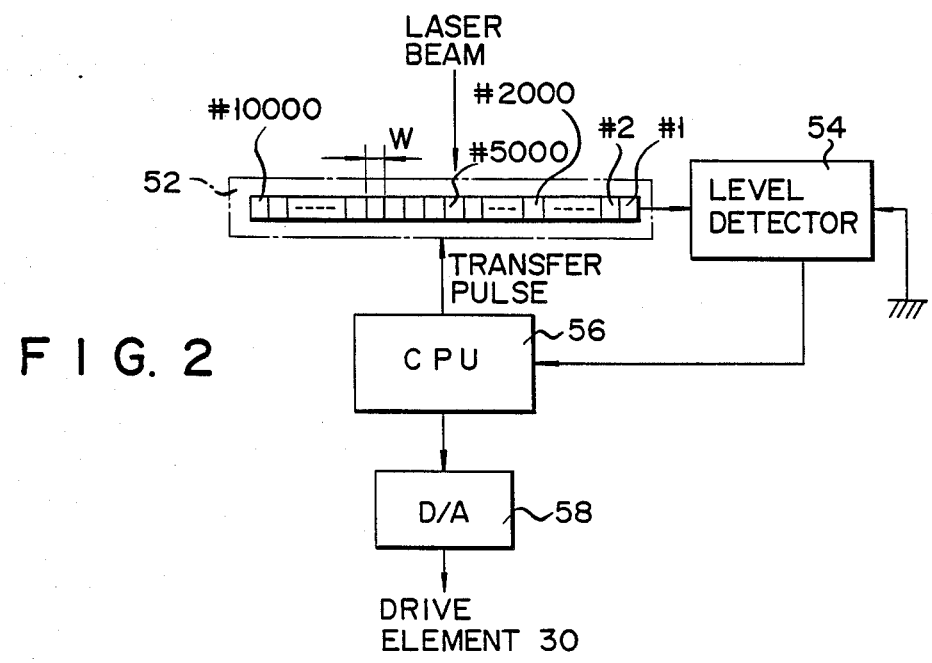
Fig. 2 shows in block and schematic form an inclination detector unit used in the apparatus of FIG. 1.

The arrangement and operation of inclination detector 26 will be described with reference to FIGS. 2 and 3.

As shown, inclination detector 26 is made up of CCD (charge coupled device) line sensor 52 comprising 10,000 elements, level detector 54, CPU (central processing unit) 56, and digital to analog (D/A) converter 58. Level detector 54 compares the output potentials of line sensor 52 and a reference potential, to check if the output potential is above the reference potential. CPU 56 receives the output signal of level detector 54, computes an angle of the inclination of the exposure area with respect to the plane orthogonal to the optical axis 28, and produces a digital signal representing the computed angle of inclination. D/A converter 58 converts the digital signal from CPU 56 into an analog signal.

CCD line sensor 52 is positioned at such a location as to receive the laser beam reflected from laser source 42. More precisely, the 5,000th CCD element of the line sensor 52 is positioned on the optical path. The 5,000th element receives the reflected laser beam, if the exposure area has no inclination with respect to that plane. When receiving the reflected beam, the CCD elements are energized to generate electric charges. As a result, the potential of these energized CCD elements becomes higher than the reference potential of the elements not energized. As seen from FIG. 3, the CCD elements of the line sensor are applied with the pulse from CPU 56. Every time the pulse is applied, the charges in the CCD elements are successively transferred to level detector 54. Level detector 54 compares the input potential with the reference potential, and applies a signal representative of the comparison result to CPU 56. The comparison result signal changes when the input potential is higher than the reference potential. CPU 56 computes what number of CCD element receives the laser beam when the comparator output changes in level, by using the number of the transfer pulses thus far output. Then, it computes a difference between this number of the beam-received CCD element and the number of the reference CCD element (in this instance, the 5,000th CCD element). If the level change occurs when 2,000 transfer pulses are output, the beam-received CCD element is the 2,000th CCD element. In this case, therefore, the difference is 3,000 since 5,000−2,000. The angle of inclination of the exposure area is worked out using the difference, the width W of one CCD element as viewed in the axial direction and the distance L from the laser reflecting position to CCD sensor 52. The angle α of inclination is given by $(2,000 \times W)/2L$. A voltage to be applied to the piezo-electric element for the inclination correction is obtained by using the calculated angle of inclination and the known piezo-electric characteristic of the piezo-electric element. CPU 56 produces a digital signal representing the calculated angle of inclination, and applies it to D/A converter 58 where it is converted into a corresponding analog signal. The analog signal is applied to piezo-electric element 30 and excites it. Finally, the inclination of the exposure area on wafer 18 is corrected via support member 22.

In an alternative, angles of inclinations are detected in a plurality of places in the exposure area. An angle of inclination obtained by averaging these detected angles of inclinations is used as the angle of inclination of the exposure area. To implement this, a scanning mechanism is coupled with laser source 42. A memory is provided. Detected angles of inclinations data are stored in the memory. After the data detection is completed, CPU 56 fetches the data from the memory, and executes the averaging processing.

Figure 4:
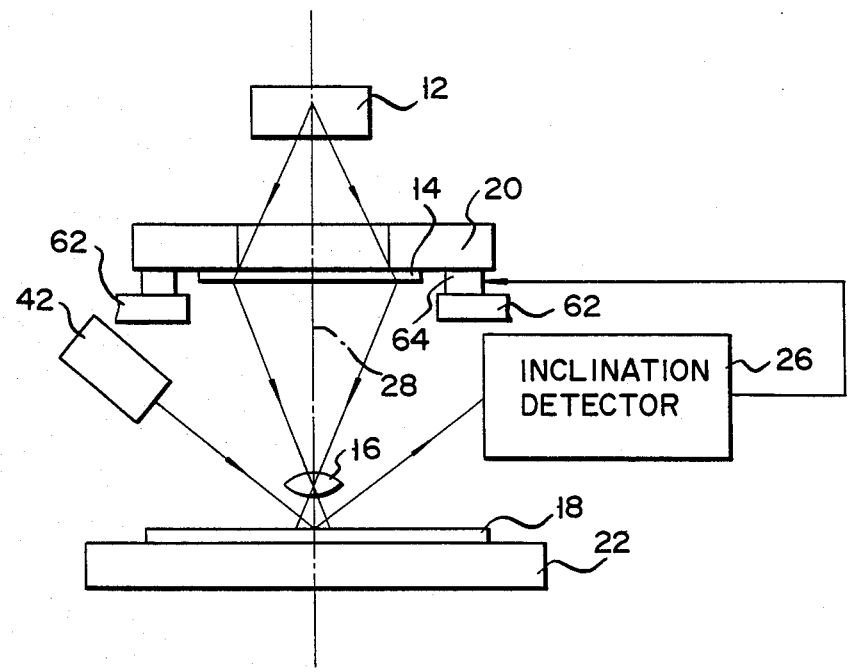
FIG. 4 is a schematic diagram illustrating a reduced projection type step- and repeat-exposure apparatus according to another embodiment of this invention.

In the above embodiment, wafer 18 is inclined by support member 22. Instead, mask 14 may be inclined by support member 20 for supporting mask 14. A configuration to realize this is illustrated in FIG. 4. As shown, mask support member 20 is disposed on an adjusting member including piezo-electric element 64, which is placed on support member 62. A correction signal from inclination detector 26 is applied to adjusting member 64.

Figure 5:
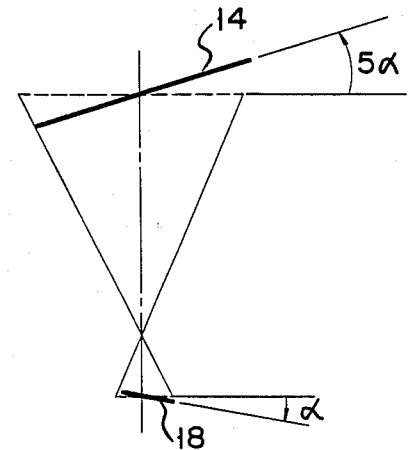
FIG. 5 is a diagram for explaining a relationship between the angle of inclination of an exposure area on the wafer and, the correction angle of the mask inclination.

As recalled, the exposure apparatus shown in FIGS. 1 and 4 is designed for the 1/5 reduced projection. To attain the reduction, mask support member 20 must be swung at 5α in the direction opposite to that of the inclination of the exposure area. α is an angle of inclination of the exposure area. Reference is made to FIG. 5. Therefore, to realize the 1/10 reduced projection, the mask support member 20 must be swung by 10α.

It is evident to those skilled in the art that wafer 18 may be inclined by using both mask and wafer support members 20 and 22, as shown in FIG. 6.

In another inclination detection, at least one planar area is formed in the scribe area 72 for parting the chip areas. The laser beam is applied to this planar area adjacent to the exposed chip area. The reflected beam is used for detection of an angle of inclination. The diameter of the laser beam used is smaller than the width of scribe area 72, in order that the laser beam projects only the scribe area 72. This detection ensures a high precision inclination detection when it is applied for the wafer with a large irregularity of the wafer surface.

Alternatively, many planar areas are formed in the scribe area. The angles of inclination data of these planar areas are collected and averaged. The average value is used as the angle of inclination of the exposed chip area. The hardware to implement this may be substantially the same as that for the averaging method for the exposed area inclination as mentioned above.

This detection of an inclination angle, however, needs a complicated optical system. This follows that the beam diameter must be smaller than the scribe area width, and that the laser beam must be exactly introduced into only the scribe area.

In a further detection of an inclination angle of the exposed area, a plurality of planar areas are arrayed in a pattern of a diffraction of the incident light rays. The diffraction rays are used for the detection of an angle of inclination.

This will be described referring to FIGS. 8 to 15.

Figure 8:
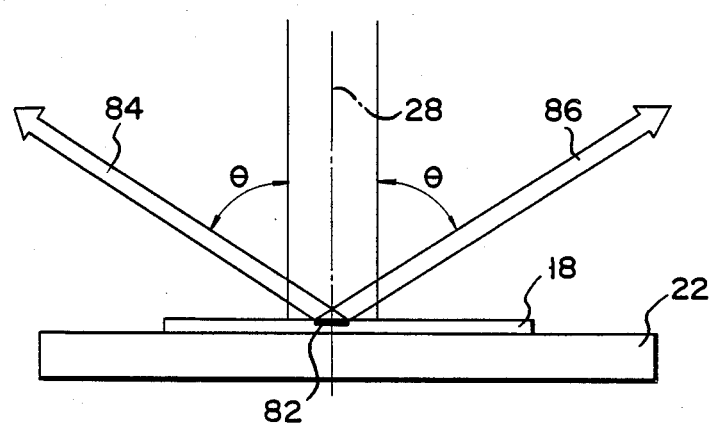
FIG. 8 is a diagram illustrating a state wherein a laser beam is incident on the wafer area having diffraction patterned areas, to produce diffraction rays.
Figure 13:
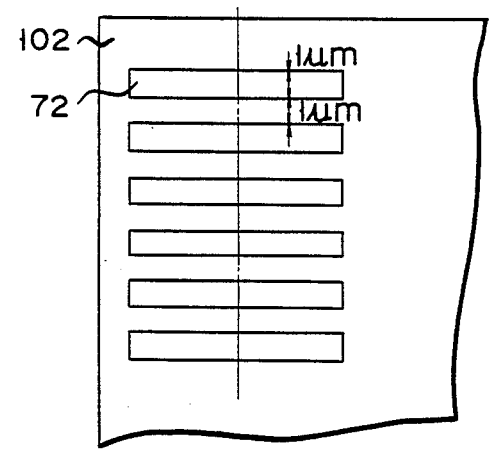
FIG. 13 is a plan view illustrating a semiconductor wafer having diffraction patterned planar areas in the chip area.
Figure 14:
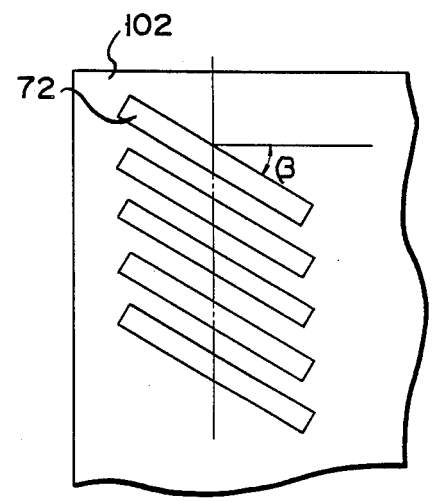
FIGS. 14 and 15 are plan views illustrating a semiconductor wafer having diffraction patterned planar areas of two other types in the chip area.
Figure 15:
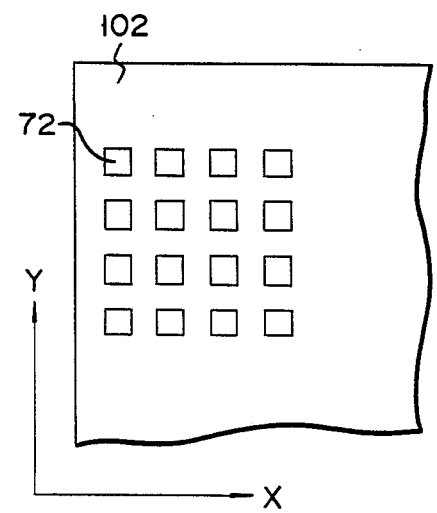

The illustration of FIG. 8 assists the description of how an angle of inclination of the exposure area is obtained by the diffraction laser beam. FIGS. 9 to 12 illustrate diffraction patterns formed in the scribe area. FIGS. 13 to 15 illustrate patterns formed in the chip area.

As shown in FIG. 8, wafer 18 with a diffraction pattern 82 is placed on support member 22. The laser beam is projected to an exposed area with the diffraction pattern, in parallel with the optical axis 28 of the exposure optical system. The diffraction beams 84 and 86 from the pattern 82 are applied to line sensors (not shown), as in the previous cases. The signals from the line sensors are input to the signal processing system following the line sensors. These signals are processed by the signal processing system, to have a diffraction angle $\theta$ and an angle $\alpha$ of inclination of the exposed area. The algorithm to obtain angle $\alpha$ of inclination follows. The relation between the inclination angle $\alpha$ and the diffraction angle $\theta$ can be described by the following mathematical expression.

$$-\sin\alpha + \sin(\theta - \alpha) = \frac{n\lambda}{d} \quad (1)$$

In the above expression, the unit of angle is radian, $\lambda$ is the wave length of laser ray, d is a pitch of the diffraction pattern, and n is the order of diffraction and includes the first order, second order, and third order, . . . Since the actual inclination $\alpha$ is very small, the relation (1) can be rewritten into $$-\alpha + \{\sin\theta - \alpha\cos\theta\} = \frac{n\lambda}{d} \quad (2)$$

Rearranging the relation (2), we have $$\alpha = \frac{\sin\theta - n\lambda/d}{\cos\theta + 1} \quad (3)$$

In the FIG. 8 embodiment, the laser beam is orthogonal to the diffraction pattern. It is noted here that the expression (3) can also be applied, if appropriately modified, to a case where the light beam is obliquely projected to the diffraction pattern.

Figure 9:
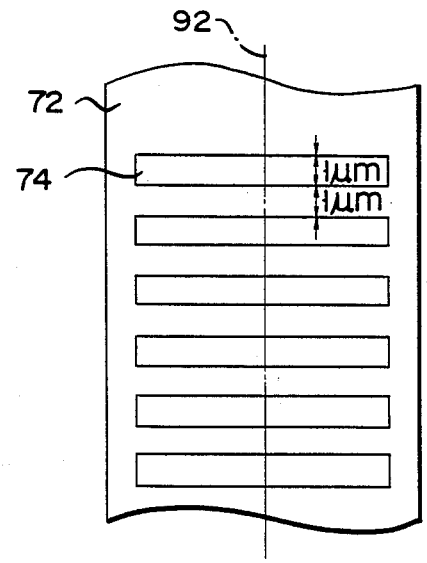
FIG. 9 is a plan view illustrating a semiconductor wafer having diffraction patterned planar areas in the scribe area.

FIG. 9 shows an example of the diffraction patterns. In this example, a plurality of rectangular planar areas 74 is arrayed in a diffraction pattern in scribe area 72. These rectangular planar areas extend in parallel one another with a space therebetween and normal to the axial line 92 of scribe area 72. The width of each planar area is 1 $\mu$m, and the space between two adjacent planar areas is 1 $\mu$m. Then, the pitch of the planer areas is 2 $\mu$m. When the wavelength of the laser beam is 1 $\mu$m, the refraction angle $\theta$ is about 30°.

In manufacturing the semiconductor devices, we frequently encounters wafers having a pattern similar to a diffraction pattern, which is near the diffraction pattern. To obtain an exact angle of inclination of the exposure area, the diffraction beam from the diffraction pattern must be discriminated from that of the similar pattern. This discrimination makes the data processing complicated. To avoid this, such pattern is not provided near the diffraction pattern, or the laser beam diameter is selected such that the beam is led to the area substantially within the scribe area.

Figure 10:
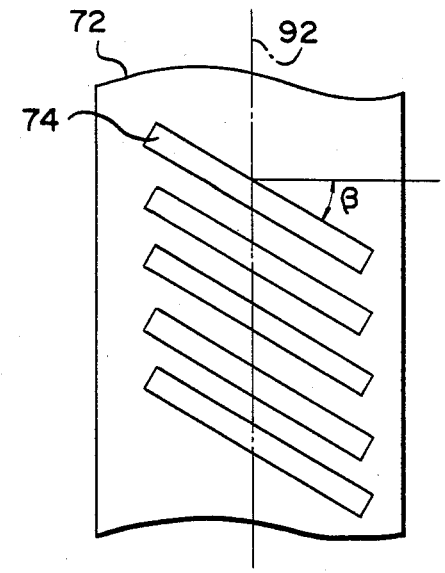
FIG. 10 is a plan view illustrating a semiconductor wafer having diffraction patterned planar areas of another type in the scribe area.

Another diffraction pattern of planar areas is shown in FIG. 10. Each planar area is rectangular in shape. These planar areas are arrayed equidistantly and in parallel in scribe area 72, but slanted with respect to axis 92 at an angle of $\beta$. The angle $\beta$ is preferably selected to be any of the angles, which are not or rarely used in the pattern in the exposure area. Such angles are, for example, 25°, 75°, and 45°. If such an angle is selected, it is not necessary to limit the laser beam diameter within the scribe area 72, and the detection of an inclination angle can be made more easy.

Figure 11:
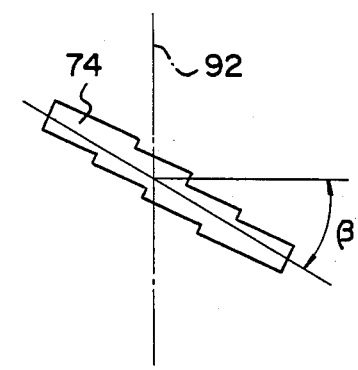
FIG. 11 shows a plan view of a modification of the pattern shown in FIG. 10.

Use of the limited angle of 25° or 75° makes the manufacturing process complicated. This problem can be solved by changing each planar pattern in the FIG. 10 to that as shown in FIG. 11. As shown, the pattern has long sides shaped stepwise, and is slanted by angle $\beta$ with respect to axial line 92.

Figure 12:
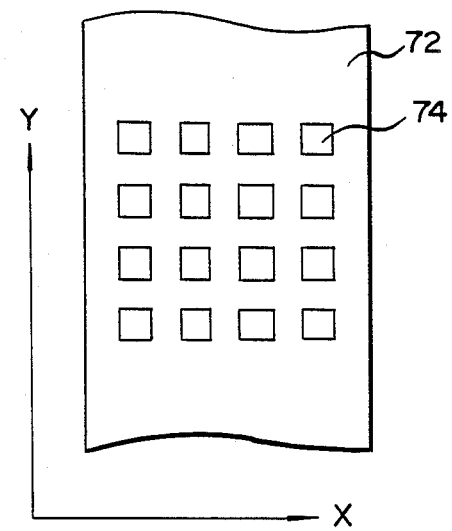
FIG. 12 is a plan view illustrating a semiconductor wafer having diffraction patterned planar areas of yet another type in the scribe area.

A further diffraction pattern is illustrated in FIG. 12. This pattern is a matrix of square planar areas 74 in the scribe area 72. In the pattern, the diffraction light beam is generated in the X and Y directions, which are orthogonal to each other. In this instance, line sensors are disposed for receiving these X and Y directional diffraction light beams. The signal processings subsequent to the detection of the diffraction light beam are similar to that of the first embodiment, and inclinations in the X and Y directions are obtained.

While a single pattern is formed in the scribe area in the above-mentioned embodiment, a plurality of patterns may be formed. In this case, the inclination angle is the average value of those inclination angles obtained from these patterns. The hardware and signal processing as already mentioned in connection with the similar cases are available.

The diffraction patterns of FIGS. 9, 11 and 12 may be formed in the chip area, not in the scribe area. The illustrations of FIGS. 13 to 15 show the patterns formed in chip area 102. The difference of these cases from the cases of FIGS. 9, 11 and 12 is only the use of the chip area instead of the scribe area. Hence, no further explanation will be given.

As seen from the foregoing description, the reduced projection type step- and repeat-exposure apparatus detects an angle of inclination of the exposure area with respect to the plane orthogonal to the optical axis of the exposure optical system, and corrects the detected angle of inclination. Thereafter, a pattern is formed on the exposure area. Therefore, a high precision patterning is possible even if the focus margin of the exposure optical system is small, e.g., less than 3 μm.

What is claimed is:

1. A reduced projection type step- and repeat- exposure apparatus comprising:
   an exposure optical system;
   mask support means for supporting a mask having a predetermined pattern, said mask being arranged in an optical path of said exposure optical system;
   wafer support means for supporting a semiconductor wafer which is exposed by said exposure system through said mask, said wafer having a planar area formed on a portion of said wafer other than a semiconductor element forming portion;
   inclination detecting means for detecting an angle of inclination of an exposure area of said wafer with respect to a plane orthogonal to the optical path of said exposure system, said inclination detecting means including a laser beam source for emitting a laser beam toward said planar area formed on said wafer, and means for computing said angle of inclination of said exposure area in accordance with a laser beam reflected from said planar area; and
   inclination correcting means for correcting said angle of inclination of said exposure area in accordance with an output signal generated by said inclination detecting means.

2. The apparatus according to claim 1, in which said inclination correcting means includes support means mounted on said wafer support means, said drive means being excited by the output signal from said inclination detecting means, to drive said wafer drive means and to correct the angle of inclination of said exposure area.

3. The apparatus according to claim 2, in which said drive means is a piezo-electric element.

4. The apparatus according to claim 1, in which said inclination correcting means includes drive means mounted on said mask support means, said drive means being excited by the output signal from said inclination detecting means, to drive said mask drive means and to correct the angle of inclination of said exposure area.

5. The apparatus according to claim 4, in which said drive means is a piezo-electric element.

6. The apparatus according to claim 1, in which said inclination correcting means includes drive means mounted on said wafer support means, said drive means being excited by the output signal from said inclination detecting means, to support said wafer drive means and to correct the angle of inclination of said exposure area, and drive means mounted on said mask support means, said drive means being excited by the output signal from said inclination detecting means, to support said mask drive means and to correct the angle of inclination of said exposure area.

7. The apparatus according to claim 6, in which said drive means are each a piezo-electric element.

8. The apparatus according to claim 1, in which said exposure area of said wafer is a chip area defined by said scribe area.

9. The apparatus according to claim 1, in which said planar area is formed on a scribe area defining a chip area of said wafer.

10. The apparatus according to claim 9, in which said inclination detecting means includes a laser source for emitting a laser beam toward said planar area of said scribe area, and means for computing an angle of inclination of said exposure area by using the laser beam reflected from said planer area.

11. The apparatus according to claim 9, in which a plurality of planar areas including said planar area are formed on said scribe area, and said inclination detecting means includes a laser scanning means for scanning said plurality of planar areas on said scribe area by a laser beam, and means for receiving a laser beam reflected from said plurality of planar areas, and means for detecting angles for inclination of a plurality of locations in said exposure area and for averaging said angles of inclinations.

12. A reduced projection type step- and repeat- exposure apparatus comprising:
   an exposure optical system;
   mask support means for supporting a mask having a predetermined pattern, said mask being arranged in an optical path of said exposure optical system;
   wafer support means for supporting a semiconductor wafer which is exposed by said exposure system through said mask, said wafer having a planar area formed on a portion of said wafer other than a semiconductor element forming portion;
   inclination detecting mans for detecting an angle of inclination of an exposure area of said wafer with respect to a plane orthogonal to the optical path of said exposure system, said inclination detecting means including a laser scanning means for scanning said planar area formed on said wafer by a laser beam, means for receiving a laser beam reflected from said planar area, and means for detecting angles of inclination of a plurality of locations in said exposure area, and for averaging said angles of inclination; and
   inclination correcting means for correcting said angle of inclination of said exposure area in accordance with an output signal generated by said inclination detecting means.

13. A reduced projection type step- and repeat- exposure apparatus comprising:
   an exposure optical system;
   mask support means for supporting a mask having a predetermined pattern, said mask being arranged in an optical path of said exposure optical system;
   wafer support means for supporting a semiconductor wafer which is exposed by said system through said mask, said wafer comprising a scribe area defining a chip area, said scribe area having a diffraction pattern formed thereon;
   inclination detecting means for detecting an angle of inclination of an exposure area of said wafer with respect to a plane orthogonal to the optical path of said exposure system, said inclination detecting means including a laser beam source for emitting a laser beam toward said diffraction pattern formed on said scribe area, and means for computing said angle of inclination of said exposure area in accordance with a laser beam reflected form said diffraction pattern; and inclination correcting means for correcting said angle of inclination of said exposure area on the basis of an output signal from said detecting means.

14. The apparatus according to claim 13, in which said diffraction pattern is formed of a plurality of rectangular patterns which are spaced equidistantly and in parallel relative to one another in an array, and extend in a direction orthogonal to the axis of said scribe area.

15. The apparatus according to claim 13, in which said diffraction pattern is formed by rectangular patterns which are spaced equidistantly and in parallel relative to one another in an array, and extend in a direction oblique to the axis of said scribe area.

16. The apparatus according to claim 13, in which said diffraction pattern is formed by square patterns which are disposed in a matrix fashion.

17. A reduced projection type step- and repeat- exposure apparatus comprising:
an exposure optical system;
mask support means for supporting a mask having a predetermined pattern, said mask being arranged in an optical path of said exposure optical system;
wafer support means for supporting a semiconductor wafer which is exposed by said exposure system through said mask, said wafer comprising a scribe area defining a chip area, said scribe area having a diffraction pattern formed thereon;
inclination detecting means for detecting an angle of inclination of an exposure area of said wafer with respect to a plane orthogonal to the optical axis of said exposure system, said inclination detecting means including a laser scanning means for scanning said diffraction pattern formed on said scribe area by a laser beam, and means for receiving a laser beam reflected from said diffraction pattern and for detecting angles of inclination of a plurality of locations in said exposure area and for averaging said angles of inclination; and
inclination correcting means for correcting said angle of inclination of said exposure area on the basis of an output signal from said detecting means.

* * * * *

UNITED STATES PATENT AND TRADEMARK OFFICE
CERTIFICATE OF CORRECTION

PATENT NO. : 4,845,530
DATED : July 4, 1989
INVENTOR(S) : Naohiro Matsukawa

It is certified that error appears in the above-identified patent and that said Letters Patent is hereby corrected as shown below:

Claim 4, column 7, line 48, change "drive" to --support--.

Signed and Sealed this

Sixteenth Day of October, 1990

*Attest:*

HARRY F. MANBECK, JR.

*Attesting Officer*     *Commissioner of Patents and Trademarks*